United States Patent
Miyazaki

(10) Patent No.: US 10,483,965 B1
(45) Date of Patent: Nov. 19, 2019

(54) SEMICONDUCTOR DEVICE

(71) Applicant: Mitsubishi Electric Corporation, Tokyo (JP)

(72) Inventor: Yuji Miyazaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/234,328

(22) Filed: Dec. 27, 2018

(30) Foreign Application Priority Data

May 30, 2018 (JP) .................................. 2018-103812

(51) Int. Cl.
*H03K 17/567* (2006.01)
*H01L 23/538* (2006.01)
*H03K 17/64* (2006.01)

(52) U.S. Cl.
CPC ....... *H03K 17/567* (2013.01); *H01L 23/5384* (2013.01); *H01L 23/5386* (2013.01); *H03K 17/64* (2013.01)

(58) Field of Classification Search
None
See application file for complete search history.

(56) References Cited

U.S. PATENT DOCUMENTS 6,937,086 B1 * 8/2005 You .......................... H03K 5/08
327/404
10,079,599 B2 * 9/2018 Kartal .................. H03K 17/122

FOREIGN PATENT DOCUMENTS

JP            201811096 A       1/2018

* cited by examiner

*Primary Examiner* — Jeffery S Zweizig
(74) *Attorney, Agent, or Firm* — Studebaker & Brackett PC

(57) ABSTRACT

Examples of a semiconductor device includes a first switching element including a first gate, a first source connected to a common terminal via a first connection line, and a first drain, a second switching element including a second gate, a second source that is connected to the first source via a second connection line and connected to the common terminal via the first connection line and the second connection line, a first capacitor for connecting the first source and a high voltage side of a power supply, a first circuit element having first end connected between the high voltage side of the power supply and the first capacitor, and a second capacitor for connecting the second source and second end of the first circuit element.

16 Claims, 5 Drawing Sheets

US 10,483,965 B1

SEMICONDUCTOR DEVICE

BACKGROUND

Field

Examples are described which relate to a semiconductor device.

Background Art

Japanese Unexamined Patent Application Publication No. 2018-11096 A discloses a gate drive circuit for suppressing occurrence of an overvoltage in a circuit in which impedance means is connected between each emitter of IGBTs connected in parallel and a 0-V terminal of a gate power supply circuit. In this gate drive circuit, the impedance means is provided between the emitter of each IGBT and the 0-V terminal of the gate power supply circuit in order to suppress current occurring due to parasitic inductance generated in a main circuit of IGBT when each IGBT is set to a conduction state. Series circuits each including Zener diodes which are connected in parallel to each other on the same polarity side are connected to these impedance means in parallel, respectively.

In the gate drive circuit disclosed in Japanese Unexamined Patent Application Publication No. 2018-11096 A, a gate overvoltage and current imbalance between elements connected in parallel occur until the Zener diode inserted between the sources of the elements connected in parallel performs a conductive operation.

In a semiconductor device in which plural switching elements are connected in parallel, it is conceivable to unify a main circuit wiring inductance for each switching element in order to suppress the current imbalance, but this has caused a problem that total inductance increases. Also, when the number of switching elements connected in parallel increases, there is a limit to coping with the increase of the number.

SUMMARY

The present invention has been made to solve the problems as described above, and has an object to provide a semiconductor device capable of suppressing current imbalance in a semiconductor device in which plural switching elements are connected in parallel.

In some examples, a semiconductor device includes a first switching element including a first gate, a first source connected to a common terminal via a first connection line, and a first drain, a second switching element including a second gate, a second source that is connected to the first source via a second connection line and connected to the common terminal via the first connection line and the second connection line, a first capacitor for connecting the first source and a high voltage side of a power supply, a first circuit element having first end connected between the high voltage side of the power supply and the first capacitor, and a second capacitor for connecting the second source and second end of the first circuit element.

Other and further objects, features and advantages will appear more fully from the following description.

DETAILED DESCRIPTION

A semiconductor device according to the examples will be described with reference to the drawings. The same or corresponding constituent elements are represented by the same reference signs, and duplicative description thereof may be omitted.

First Embodiment

Figure 1:
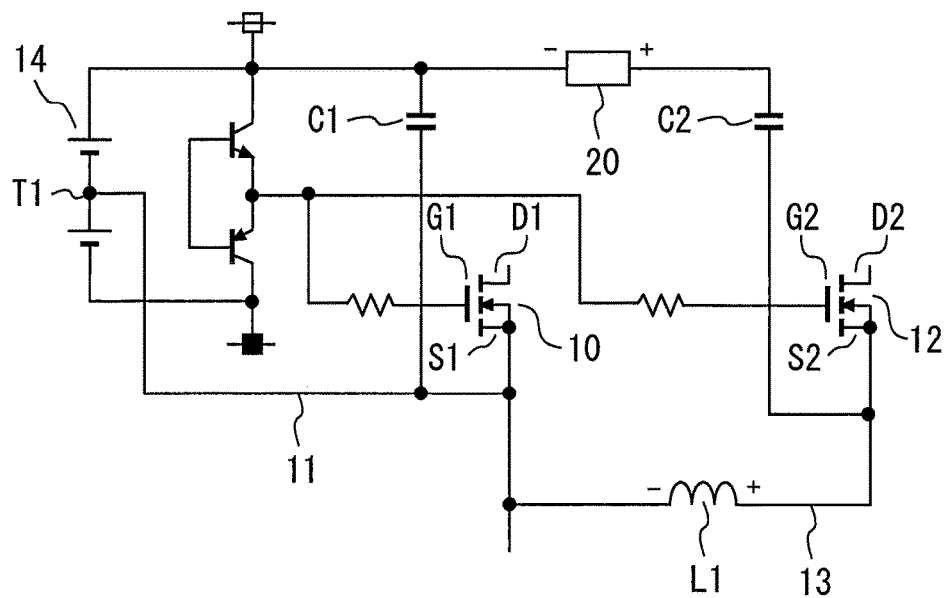
FIG. 1 is a circuit diagram of a semiconductor device according to a first embodiment.

FIG. 1 is a circuit diagram of a semiconductor device according to a first embodiment. This semiconductor device includes a first switching element 10 and a second switching element 12. The first switching element 10 includes a first gate G1, a first source S1, and a first drain D1. The first source S1 is connected to a common terminal T1 via a first connection line 11. The common terminal T1 may be, for example, a midpoint of a power supply 14.

The second switching element 12 includes a second gate G2, a second source S2, and a second drain D2 connected to the first drain D1. The second source S2 is connected to the first source S1 via a second connection line 13. The second source S2 is connected to the common terminal T1 via the first connection line 11 and the second connection line 13. The common terminal T1 may be also referred to as a power terminal. As described above, the first switching element 10 and the second switching element 12 are connected to each other in parallel. The first switching element 10 and the second switching element 12 may be, for example, an IGBT (Insulated Gate Bipolar Transistor) or a power MOSFET. The first switching element 10 and the second switching element 12 may be power chips for switching large currents.

The first source S1 and a high voltage side of the power supply 14 are connected to each other by a first capacitor C1. First end of a first circuit element 20 is connected between the high voltage side of the power supply 14 and the first capacitor C1. Any element having a large transient impedance is applicable as the first circuit element 20. For example, the first circuit element 20 may be a resistance element, an inductance element or a diode. The second source S2 and the second end of the first circuit element 20 are connected to each other by a second capacitor C2.

As described above, the first source S1 and the second source S2 are provided with a capacitor for power supply. That is, the first source S1 is connected to the high voltage side of the power supply 14 without interposing the element. The second source S2 is connected to the high voltage side of the power supply 14 via the first circuit element 20.

When the first switching element 10 and the second switching element 12 are turned on, current variation occurs in a main circuit. The distances from the common terminal T1 as a common main electrode terminal to the two switching elements are different from each other. In this example, the first source S1 is connected to the common terminal T1 via the first connection line 11, whereas the second source S2 is connected to the common terminal T1 via the first and second connection lines 11 and 13. Accordingly, the second switching element 12 is farther from the common terminal T1 than the first switching element 10. Therefore, while the current variation occurs in the two switching elements, the source potential of the second switching element 12 is larger than the source potential of the first switching element 10. This potential difference is given by the product of a parasitic inductance L1 of the second connection line 13 and a current variation rate, and it reaches several volts. The difference between the two source potentials is represented by ΔV.

When the first capacitor C1, the second capacitor C2 and the first circuit element 20 are not provided, an effective gate power supply voltage applied to the second switching element 12 is equal to a value obtained by subtracting ΔV from a gate driving positive voltage. Therefore, the voltage variation at the rising of the gate of the second switching element 12 is suppressed, and a difference occurs in the current variation rate di/dt flowing in the element between the second switching element 12 and the first switching element 10 which is not influenced by ΔV. Specifically, the switching speed of the second switching element 12 becomes slower than that of the first switching element 10, and a transient current imbalance may occur at the time of switching.

This problem may occur commonly in configurations in which plural switching elements are connected in parallel. Specifically, when plural driving sources are connected to wires, a difference occurs in the switching speed between the elements connected in parallel due to an induced electromotive force of the main circuit wiring inductance. For example, in the case of SiC-MOSFET, this problem is remarkable since plural small chips are often connected in parallel.

However, according to the semiconductor device of the first embodiment, the current imbalance can be suppressed by providing the first capacitor C1, the second capacitor C2, and the first circuit element 20. The induced electromotive force of the second connection line L2 is reflected to a voltage across the first circuit element 20. When the induced electromotive force occurs in the second connection line L2, the voltage across the first capacitor C1 and the voltage across the second capacitor C2 can be substantially equalized to each other. As a result, the switching speed of the second switching element 12 can be corrected to be equal to the switching speed of the first switching element 10. Accordingly, it is possible to improve the balance in the switching speed between the first and second switching elements 10, 12, and suppress the current imbalance. Moreover, since this action limitedly works during only a period when the current variation rate di/dt occurs in each switching element, it does not affect a delay time from the start of the gate operation until the current variation rate di/dt occurs. Furthermore, since there is no addition of inductance to the first connection line 11 and the second connection line 13, the switching balance can be corrected without sacrificing the main circuit inductance.

A voltage is applied from the power supply 14 to the first gate G1 and the second gate G2. The first capacitor C1 and the second capacitor C2 are in charge of supplying gate charges. Therefore, the capacitances of these capacitors are required to be not less than the capacitance Cgs between the gate and the source of the switching element. Specifically, the capacitance of the first capacitor C1 can be set to be equal to or higher than the capacitance between the first gate G1 and the first source S1, and the capacitance of the second capacitor C2 can be set to be equal to or higher than the capacitance between the second gate G2 and the second source S2.

The first switching element 10 or the second switching element 12 may be formed of silicon, or may be formed of a wide bandgap semiconductor having a larger bandgap than silicon. For example, silicon carbide, a gallium-nitride-based material or diamond are available as the wide bandgap semiconductor. For example, with respect to SiC-MOSFET, the yield of large-area chips is low at the present time, and thus plural small-area chips are often connected in parallel for use. Therefore, the foregoing configuration can be applied in a SiC-MOSFET driving circuit in which plural small-area chips are connected in parallel. Furthermore, in this example, two switching elements are connected in parallel, but the number of switching elements to be connected in parallel may be larger than two.

The modification described with respect to the first embodiment can be applied to semiconductor devices according to the following embodiments. Hereinafter, the semiconductor devices according to the embodiments described below have many common points to the first embodiment, so that different points from the first embodiment will be mainly described.

Second Embodiment

Figure 2:
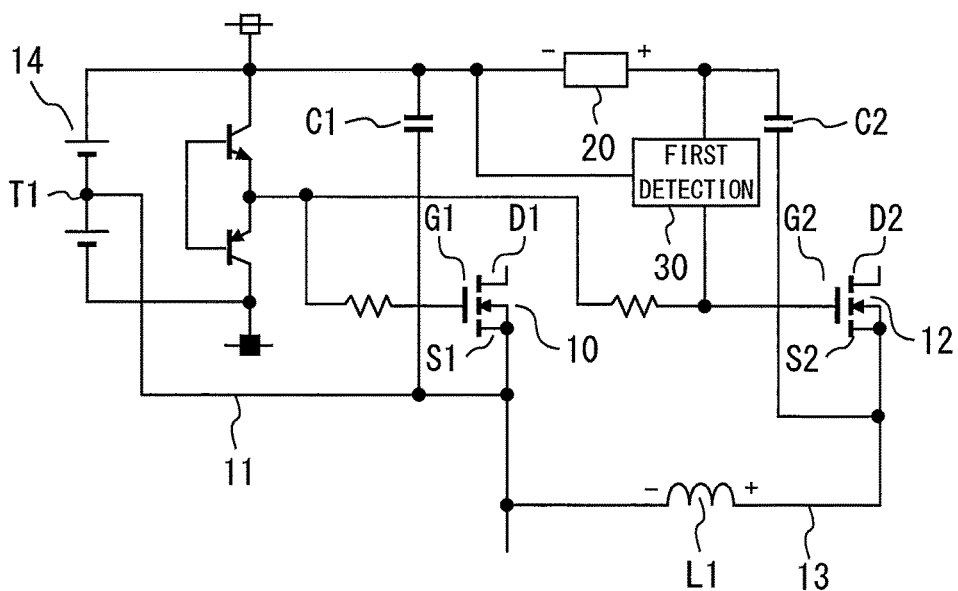
FIG. 2 is a circuit diagram of a semiconductor device according to a second embodiment.

FIG. 2 is a circuit diagram of a semiconductor device according to a second embodiment. This semiconductor device includes a first detection circuit 30. The first detection circuit 30 detects the voltage across a first circuit element 20 and supplies current to a second gate G2 when a transient voltage occurs. For example, the first detection circuit 30 may be set as a switch for causing current to flow from a positive electrode of a second capacitor C2 to the second gate G2 when the voltage across the first circuit element 20 reaches a predetermined voltage.

Figure 3:
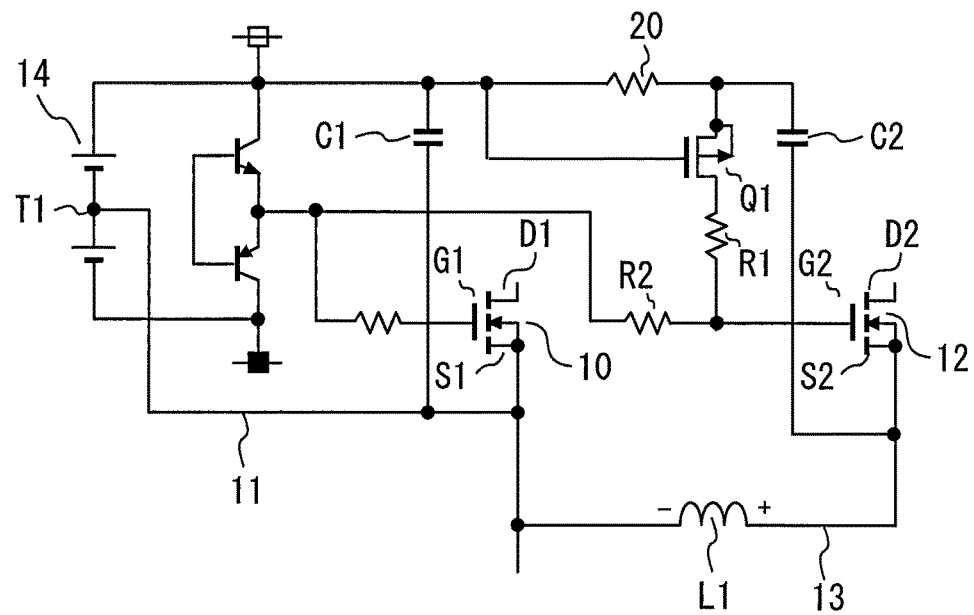
FIG. 3 a diagram showing an example of the first detection circuit.

FIG. 3 is a diagram showing an example in which the first detection circuit 30 is constituted by a switch Q1 and a resistance element R1. The first circuit element 20 is constituted by a resistance element. In this example, when first and second switching elements 10 and 12 are turned on and the induced electromotive force caused by a parasitic inductance L1 increases, the voltage across the first circuit element 20 occurs, so that the switch Q1 is set to ON-state, and charging to the second gate G2 is performed via the resistance element R1. Charges for charging the second gate G2 are supplied from the second capacitor C2. The second gate G2 is supplied with current passing through the resistance element R1 and current passing through a resistance element R2. Therefore, the driving speed of the second switching element 12 during the period in which the current variation rate di/dt occurs is higher than that in a case where there is no current passing through the resistance element R1. By appropriately adjusting the resistance value of the resistance element R1, it is possible to equalize the driving speeds of the first and second switching elements 10 and 12 to each other. That is, the switching balance can be improved. When the period in which the current variation rate di/dt occurs has passed, the switch Q1 is turned off, so that the circuit is set to a state where the driving speed of the second switching element 12 is not affected.

Third Embodiment

Figure 4:
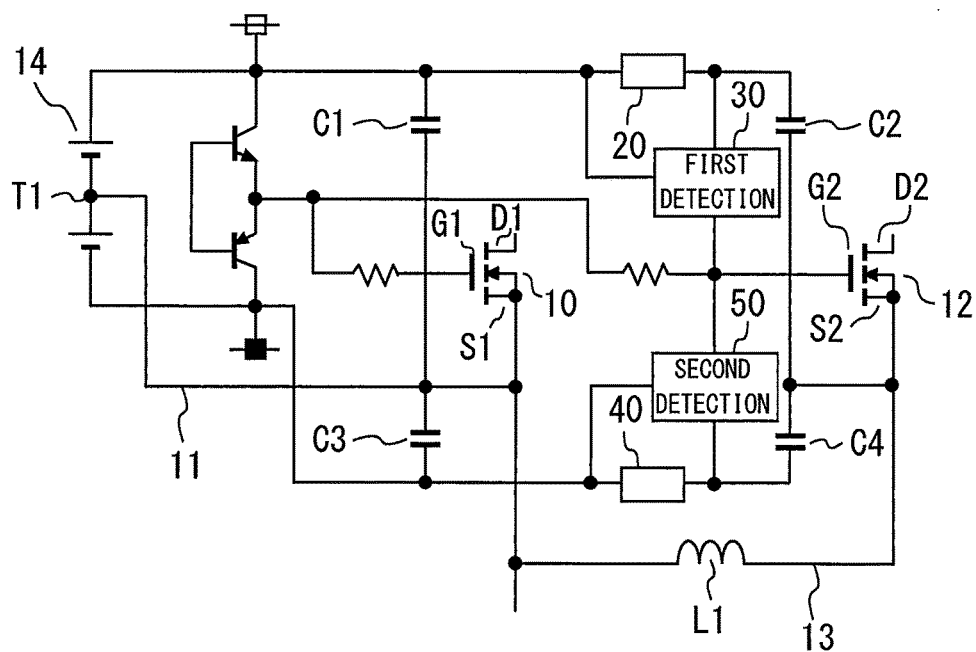
FIG. 4 is a circuit diagram of a semiconductor device according to a third embodiment.

In the first and second embodiments, the suppression of the current imbalance on the turn-on side has been described, but the current imbalance on the turn-off side can be suppressed by the same method as described above. FIG. 4 is a circuit diagram of a semiconductor device according to a third embodiment. This circuit is provided with a third capacitor C3, a fourth capacitor C4 and a second circuit element 40. The third capacitor C3 connects a first source S1 and a low voltage side of a power supply 14. First end of the second circuit element 40 is connected between the low voltage side of the power supply 14 and the third capacitor C3. The second circuit element 40 can be configured as the same element as the first circuit element 20. The fourth capacitor C4 connects a second source S2 and the second end of the second circuit element 40.

When the first and second switching elements 10 and 12 are turned off, the induced electromotive force of a second connection line 13 is reflected on the voltage across the second circuit element 40. As a result, the switching speed of the second switching element 12 can be corrected to be equal to the switching speed of the first switching element 10.

A second detection circuit 50 may be provided to this semiconductor device. The second detection circuit 50 is a circuit for causing current to flow from the positive electrode of a fourth capacitor C4 to the second gate G2 when the voltage across the second circuit element 40 reaches a predetermined voltage.

Figure 5:
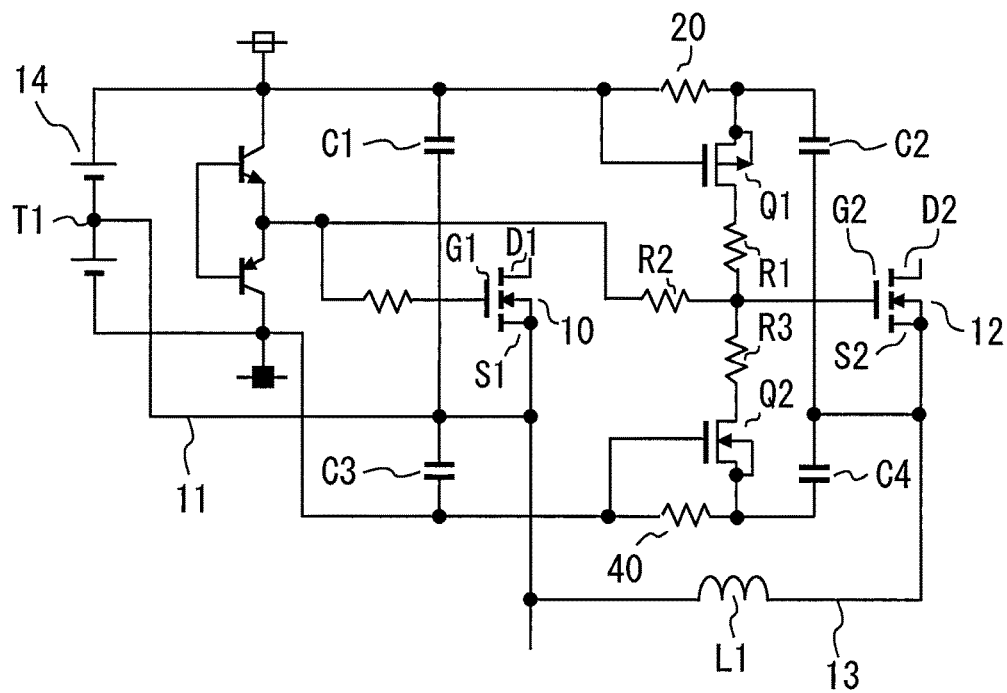
FIG. 5 is a diagram showing an example of the second detection circuit.

FIG. 5 is a diagram showing an example in which the second detection circuit 50 is constituted by a switch Q2 and a resistance element R3. When the first and second switching elements 10 and 12 are turned off and the induced electromotive force caused by a parasitic inductance L1 increases, the voltage across the second circuit element 40 occurs, so that the switch Q2 is set to ON-state, and charging to the second gate G2 is performed via the resistance element R3. Charges for charging the second gate G2 are supplied from a fourth capacitor C4. The second switching element 12 is supplied with current passing through the resistance element R3 and current passing through the resistance element R2. Therefore, the driving speed of the second switching element 12 during the period in which the current variation rate di/dt occurs is higher than that in a case where there is no current passing through the resistance element R3. By appropriately adjusting the resistance value of the resistance element R3, it is possible to equalize the driving speeds of the first and second switching elements 10 and 12 to each other, and the switching balance can be improved. When the period which the current variation rate di/dt occurs has passed, the switch Q2 is turned off, so that the circuit is set to a state where the driving speed of the second switching element 12 is not affected.

Consider a case where the first circuit element 20 is a resistance element. When a potential difference occurs between each of the positive electrode side of the first and second capacitors C1 and C2 at the time of switching, a potential difference transiently occurs between both the ends of the first circuit element 20 which is a resistance element. In order to fully achieve the above-mentioned effect, it is necessary to maintain the potential difference for at least a current transition time of switching. Therefore, the product of the capacitance of the second capacitor C2 and the resistance value of the first circuit element 20 can be set to not less than the current transition time of the second switching element 12. The product of the capacitance of the second capacitor C2 and the resistance value of the first circuit element 20 is a transient time constant. This transient time constant is set to not less than the current transition time of switching. For example, when the transition time of switching is set to 100 nsec and the capacitances of the first and second capacitors C1 and C2 are set to 10 nF, a resistance value of 10Ω or more is required. A case where the second circuit element 40 is a resistance element may also be considered in the same way.

Fourth Embodiment

Figure 6:
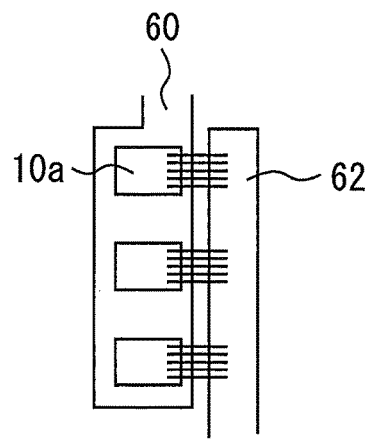
FIG. 6 shows a configuration example of the first switching element.
Figure 7:
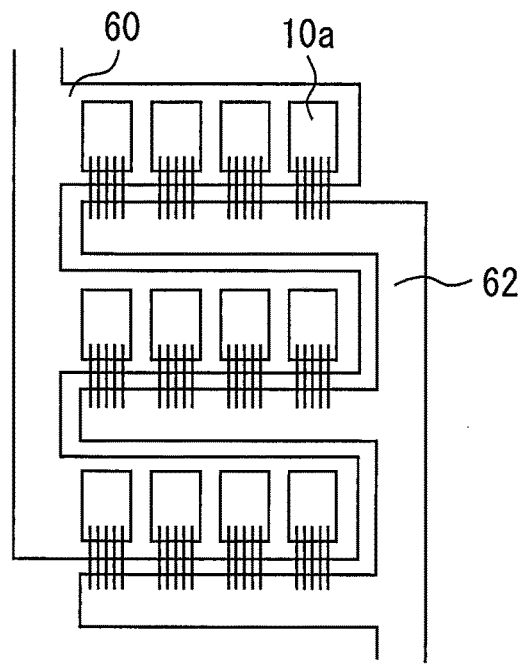
FIG. 7 shows another example of the first switching element.

FIG. 6 is a diagram showing a configuration example of the first switching element 10. The first switching element 10 has plural island-shaped chips 10a. The back surfaces of the plural chips 10a are connected to a collector pattern 60, and the sources are connected to the source pattern 62 by wires. FIG. 7 shows another example of the plural island-shaped chips 10a provided to the first switching element 10. FIGS. 6 and 7 show that one switching element has plural island-shaped chips. The second switching element 12 may also be configured the same as the first switching element 10. The current imbalance among the plural island-shaped chips is suppressed by providing the capacitors and the circuit elements described above.

For example, one switching element such as the first switching element 10 may also be configured as a module having plural chips. When at least one of the first switching element 10 and the second switching element 12 is configured as a module, the current imbalance between the modules is suppressed by providing the capacitors and the circuit elements described above.

Fifth Embodiment

Figure 8:
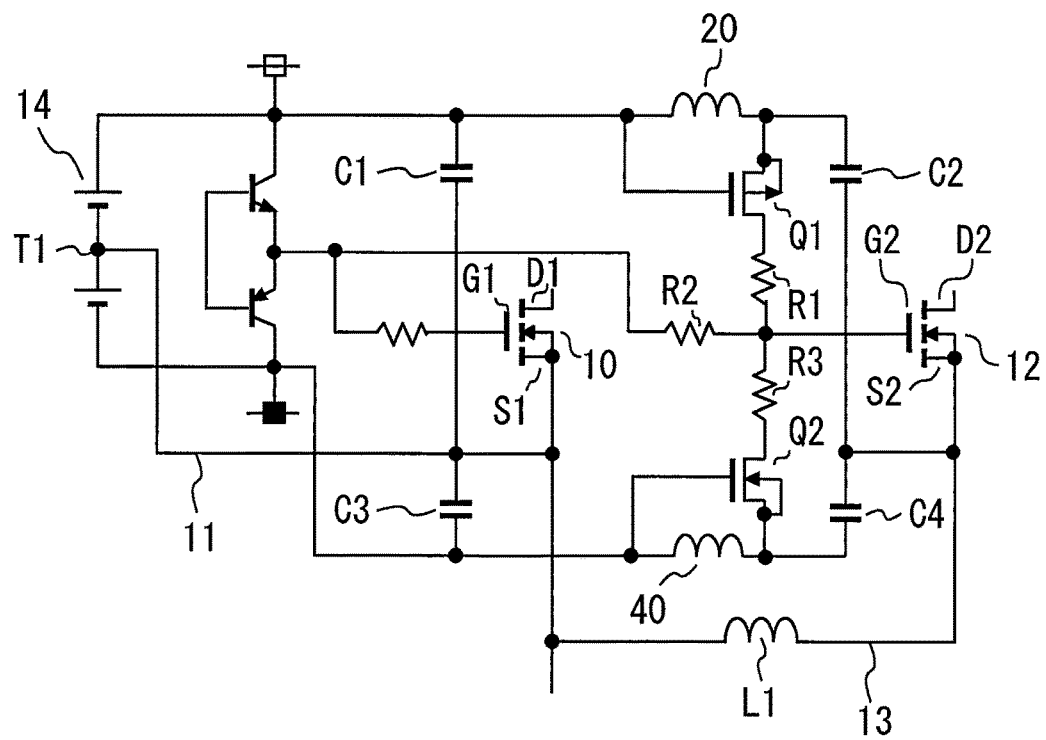
FIG. 8 is a circuit diagram of a semiconductor device according to a fifth embodiment.

FIG. 8 is a circuit diagram of a semiconductor device according to a fifth embodiment. In this semiconductor device, the first circuit element 20 and the second circuit element 40 are configured as inductance elements. In order to fully achieve the above-mentioned effect, the inductance of the inductance element can be set to not less than 10 times the parasitic inductance L1 occurring between the first source S1 and the second source S2.

At this time, in order to suppress the influence on the switching balance by oscillation of the gate voltage which is caused by the first capacitor C1, the second capacitor C2 and the inductance element, it is necessary to make the capacitances of the first and second capacitors C1 and C2 as small as possible. For example, when the capacitance of the first capacitor C1 is set to C, the capacitance of the second capacitor C2 is set to C, the inductance of the inductance element is set to La, and the current transition time of the second switching element 12 is set to tr, the characteristic of each element is adjusted so as to satisfy the following formula.

$$2\pi\sqrt{(La \times C)} < tr$$

In addition to this condition, C can be set to be equal to or greater than the capacitance between the gate and the source. The same consideration can be established for the third capacitor C3 and the fourth capacitor C4.

Sixth Embodiment

Figure 9:
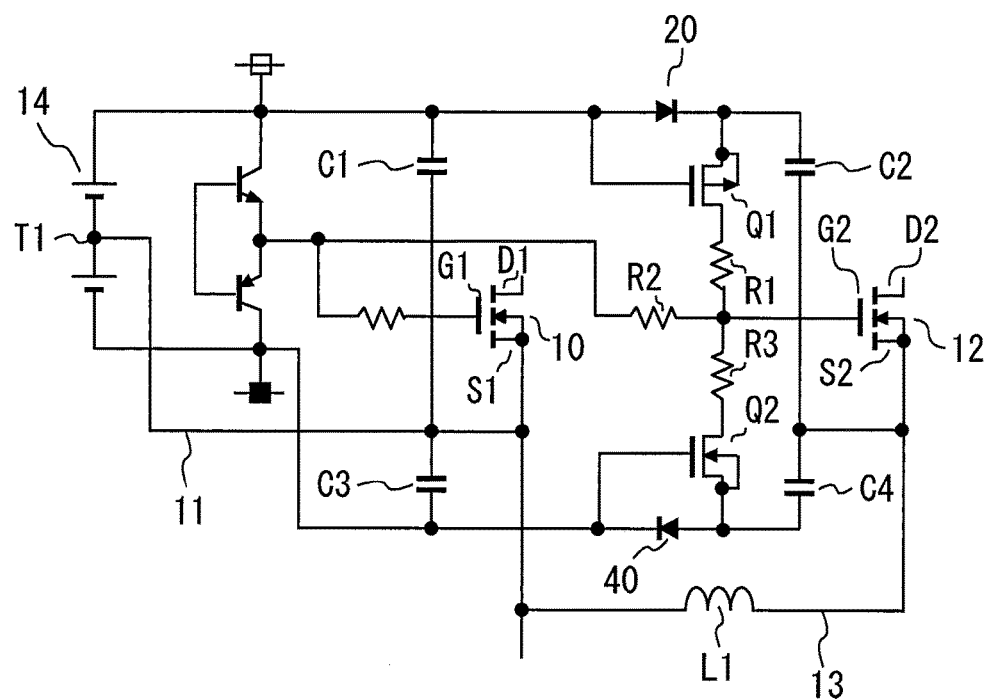
FIG. 9 is a circuit diagram of a semiconductor device according to a sixth embodiment.

FIG. 9 is a circuit diagram of a semiconductor device according to a sixth embodiment. In this semiconductor device, the first circuit element 20 and the second circuit element 40 are configured as diodes. In order to minimize, as much as possible, the voltage drops applied to the gates of the first and second switching elements 10 and 12, diodes having small forward voltages can be used. For example, Schottky barrier diodes can be used.

According to some examples, the current imbalance can be suppressed by making the source potentials of the plural switching elements more uniform.

The invention claimed is:

1. A semiconductor device comprising:
   a first switching element including a first gate, a first source connected to a common terminal via a first connection line, and a first drain;
   a second switching element including a second gate, a second source that is connected to the first source via a second connection line and connected to the common terminal via the first connection line and the second connection line;
   a first capacitor for connecting the first source and a high voltage side of a power supply;
   a first circuit element having first end connected between the high voltage side of the power supply and the first capacitor; and
   a second capacitor for connecting the second source and second end of the first circuit element.

2. The semiconductor device according to claim 1, wherein a voltage is applied from the power supply to the first gate and the second gate, a capacitance of the first capacitor is equal to or larger than a capacitance between the first gate and the first source, and a capacitance of the second capacitor is equal to or larger than a capacitance between the second gate and the second source.

3. The semiconductor device according to claim 1, further comprising a first detection circuit for causing current to flow from a positive electrode of the second capacitor to the second gate when a voltage across the first circuit element reaches a predetermined voltage.

4. The semiconductor device according to claim 1, further comprising:
   a third capacitor for connecting the first source and a low voltage side of the power supply;
   a second circuit element having first end connected between the low voltage side of the power supply and the third capacitor; and
   a fourth capacitor for connecting the second source and second end of the second circuit element.

5. The semiconductor device according to claim 4, further comprising a second detection circuit for causing current to flow from a positive electrode of the fourth capacitor to the second gate when a voltage across the second circuit element reaches a predetermined voltage.

6. The semiconductor device according to claim 1, wherein at least one of the first switching element and the second switching element has a plurality of island-shaped chips.

7. The semiconductor device according to claim 1, wherein at least one of the first switching element and the second switching element is a module having a plurality of chips.

8. The semiconductor device according to claim 1, wherein the first circuit element is a resistance element.

9. The semiconductor device according to claim 8, wherein a product of a capacitance of the second capacitor and a resistance value of the resistance element is not less than a current transition time of the second switching element.

10. The semiconductor device according to claim 4, wherein the first circuit element and the second circuit element are inductance elements.

11. The semiconductor device according to claim 10, wherein an inductance of the inductance element is not less than 10 times an inductance occurring between the first source and the second source.

12. The semiconductor device according to claim 10, wherein when a capacitance of the first capacitor is set to C, a capacitance of the second capacitor is set to C, an inductance of the inductance element is set to La, and a current transition time of the second switching element is set to tr, $2\pi\sqrt{La \times C} < tr$ is satisfied.

13. The semiconductor device according to claim 4, wherein the first circuit element and the second circuit element are diodes.

14. The semiconductor device according to claim 13, wherein the diodes are Schottky barrier diodes.

15. The semiconductor device according to claim 1, wherein the first switching element or the second switching element is formed of a wide bandgap semiconductor.

16. The semiconductor device according to claim 15, wherein the wide bandgap semiconductor is silicon carbide, a gallium-nitride-based material or diamond.

* * * * *